United States Patent
Kanazawa

(10) Patent No.: US 6,691,293 B2
(45) Date of Patent: Feb. 10, 2004

(54) LAYOUT INSTRUMENT FOR SEMICONDUCTOR INTEGRATED CIRCUITS, LAYOUT METHOD FOR SEMICONDUCTOR INTEGRATED CIRCUITS AND RECORDING MEDIUM THAT STORES A PROGRAM FOR DETERMINING LAYOUT OF SEMICONDUCTOR INTEGRATED CIRCUITS

(75) Inventor: Yuzi Kanazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 124 days.

(21) Appl. No.: 09/812,848

(22) Filed: Mar. 21, 2001

(65) Prior Publication Data

US 2002/0053067 A1 May 2, 2002

(30) Foreign Application Priority Data

Nov. 1, 2000 (JP) ........................... 2000-334146

(51) Int. Cl.$^7$ .............................................. G06F 9/455
(52) U.S. Cl. ................. 716/11; 716/3; 716/13
(58) Field of Search ................. 716/11, 13, 3, 716/12, 18; 714/726

(56) References Cited

U.S. PATENT DOCUMENTS 5,452,239 A * 9/1995 Dai et al. .................. 364/578
6,199,183 B1 * 3/2001 Nadaoka .................... 714/726
6,305,001 B1 * 10/2001 Graef ........................ 716/12
6,415,430 B1 * 7/2002 Ashar et al. ................. 716/18

FOREIGN PATENT DOCUMENTS

JP        A-8-221473        8/1996

OTHER PUBLICATIONS

Chung–Kuan Cheng, et al., "Module Placement Based on Resistive Network Optimization", IEEE Transactions on Computer–aided Design, vol. CAD–3, No. 3, Jul. 1984.

* cited by examiner

Primary Examiner—Tuan T. Lam
Assistant Examiner—Hiep Nguyen
(74) Attorney, Agent, or Firm—Staas & Halsey LLP

(57) ABSTRACT

After a provisional layout in a sub-module of a semiconductor integrated circuit is performed, a path optimizing inter-sub-modules process is executed, and the layout and wiring among sub-modules are performed. If any part of the wiring among sub-modules does not satisfy a specified delay restriction, a provisional-layout correction process is executed to correct the provisional layout of cells in a sub-module. These processes are repeated, and then an entire layout of cells is determined.

16 Claims, 20 Drawing Sheets

---

31

THE DELAY OBTAINED AS THE RESULT OF THE PATH OPTIMIZATION AMONG-SUB-MODULES PROCESS DECREASES THE WEIGHT OF THE NET THAT BELONGS TO THE PATH THAT SATISFIES THE DELAY RESTRICTIONS (i.e. WEAKENS THE STRENGTH OF THE SPRING), AND INCREASES THE WEIGHT OF THE NET THAT BELONGS TO THE PATH THAT DOES NOT SATISFY THE DELAY RESTRICTIONS (i.e. STRENGTHENS THE STRENGTH OF THE SPRING)

32

A RESISTIVE NET METHOD IS APPLIED IN ACCORDANCE WITH THE WEIGHT OF THE GIVEN NET, AND THE PROVISIONAL LAYOUT IN THE SUB-MODULES IS RE-CALCULATED

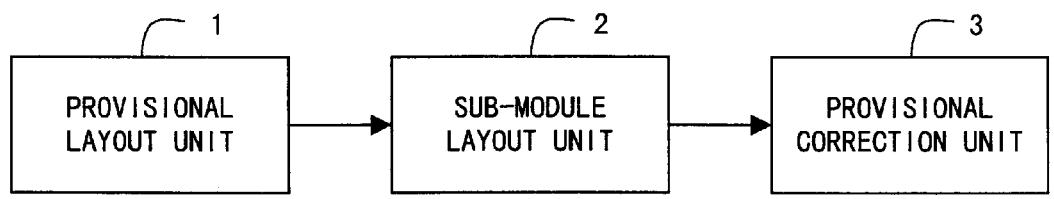
F I G. 4

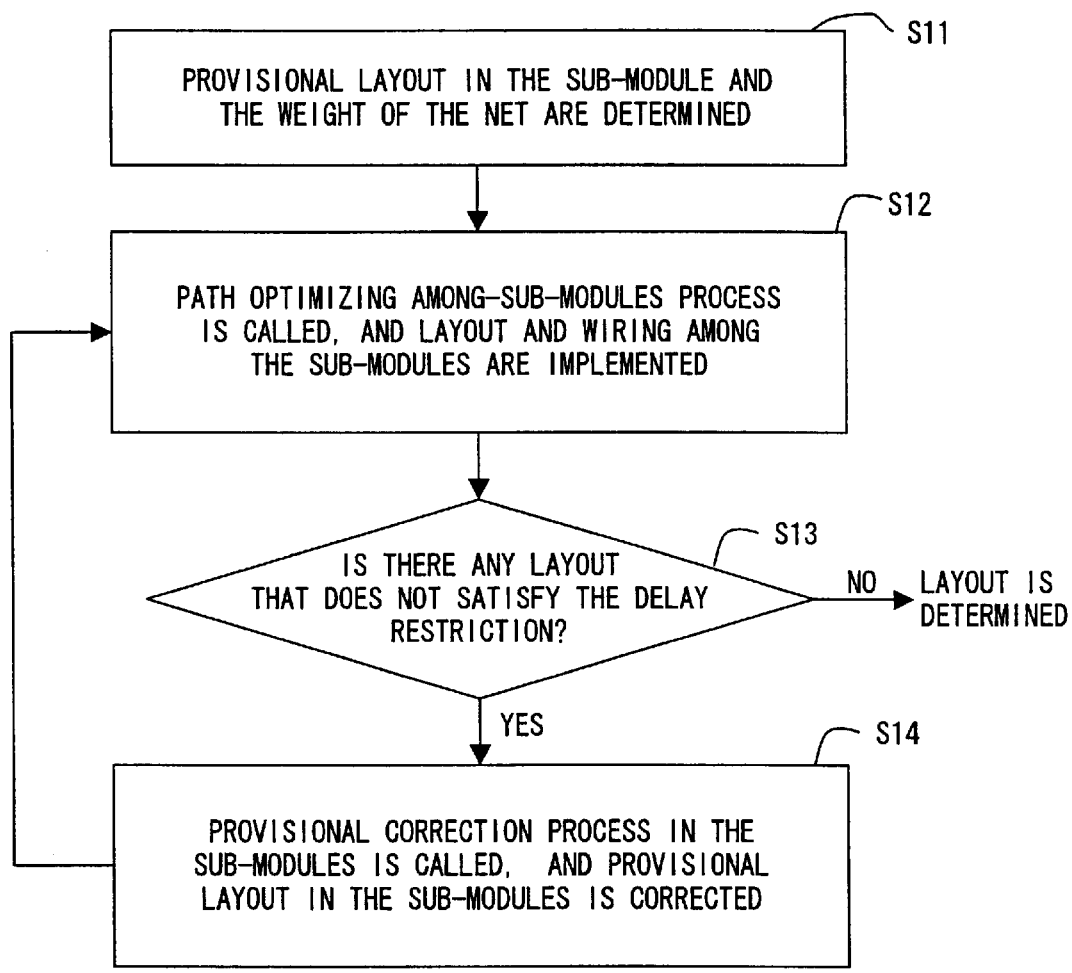
F I G. 6

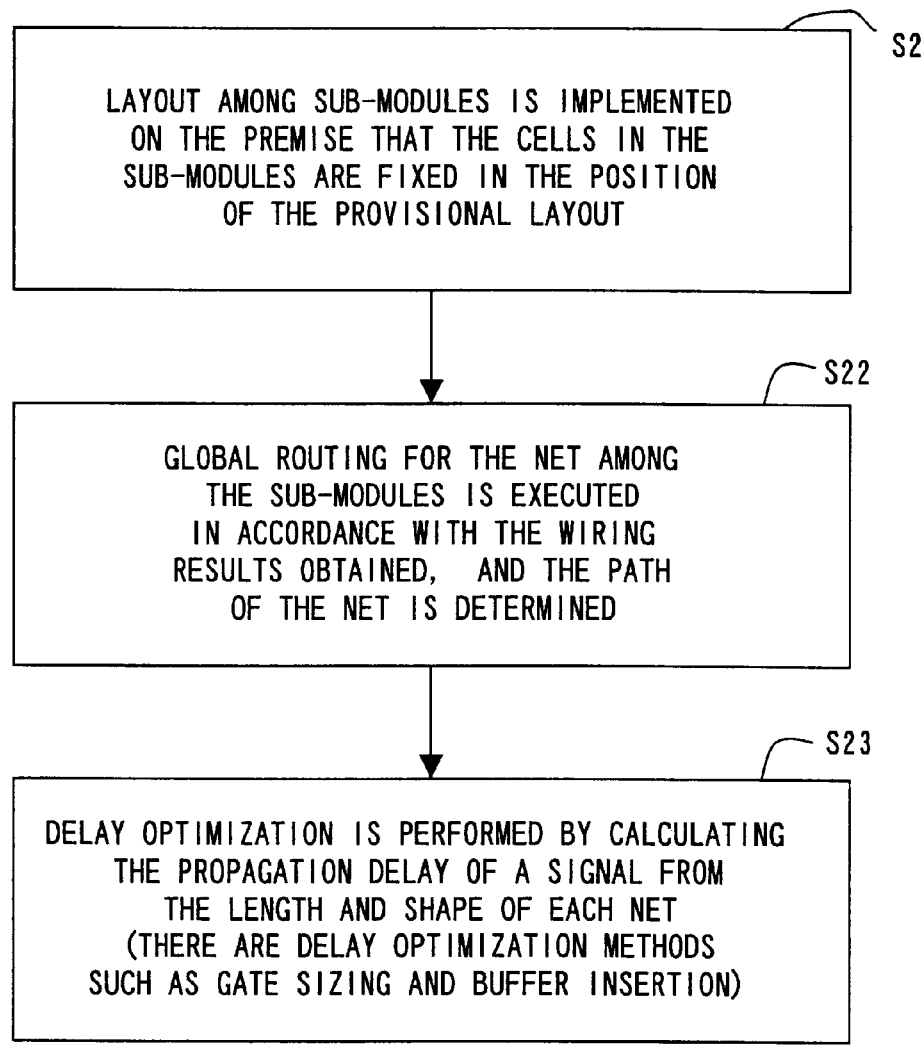
F I G. 7

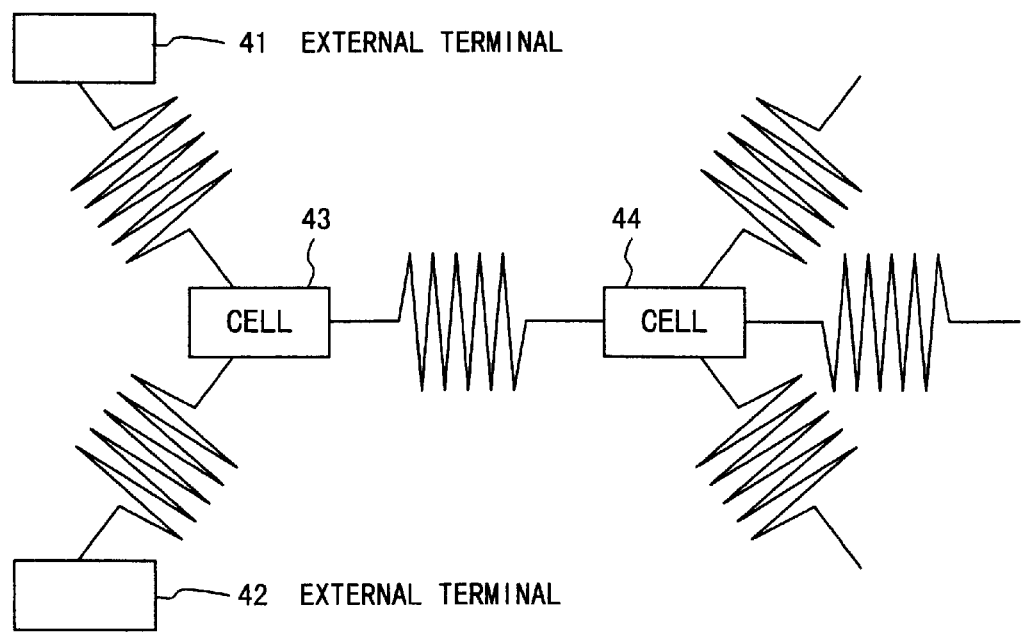
F I G. 9

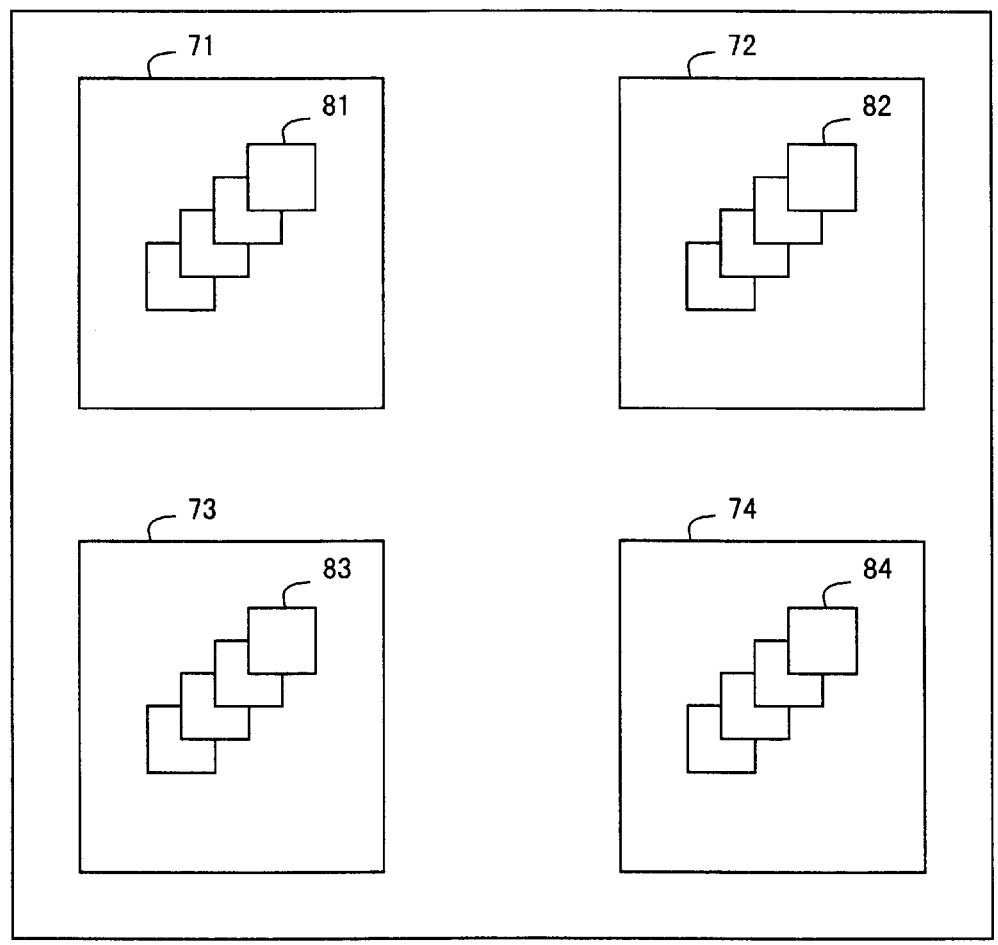
F I G. 10

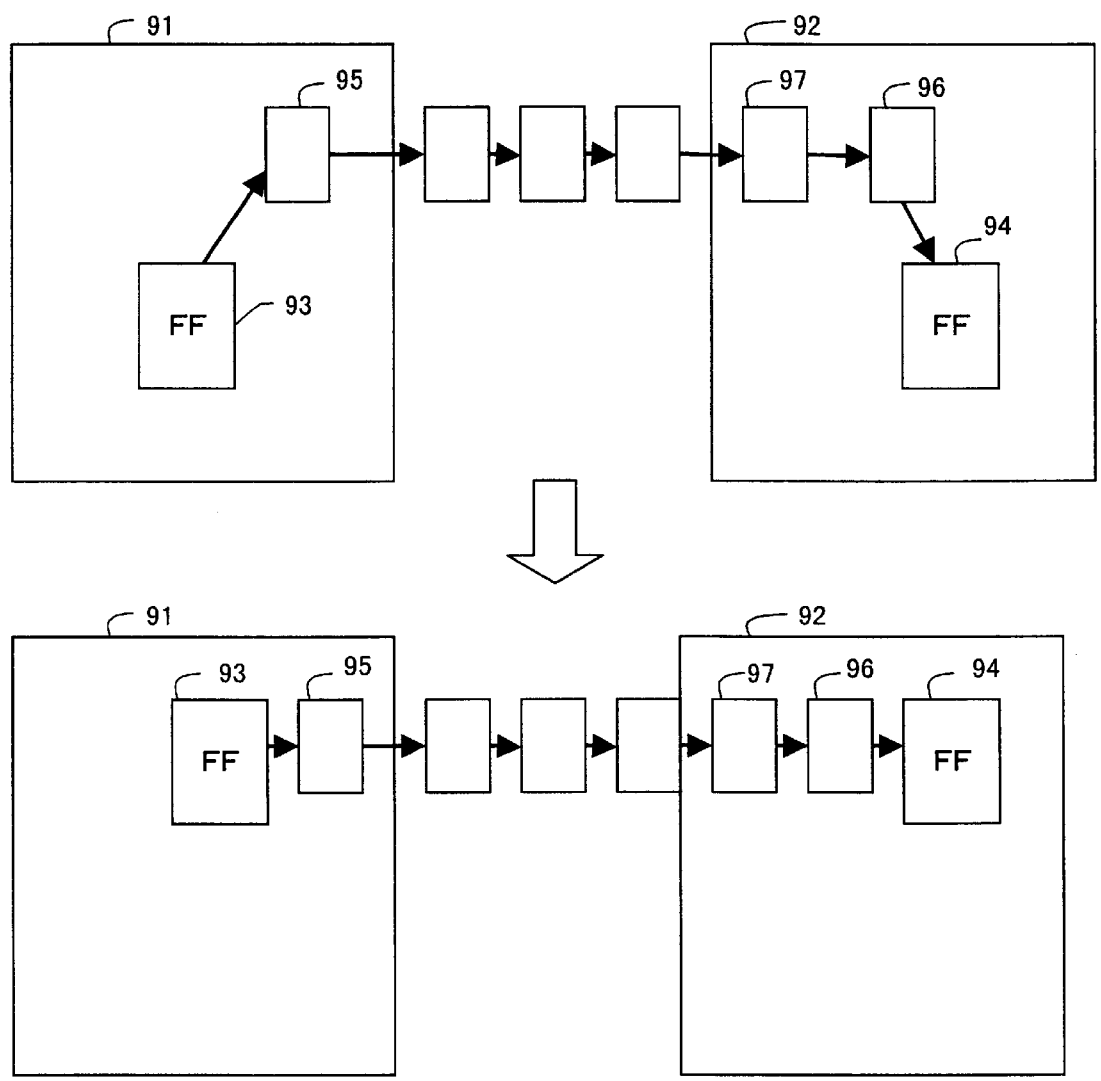
F I G. 1 3

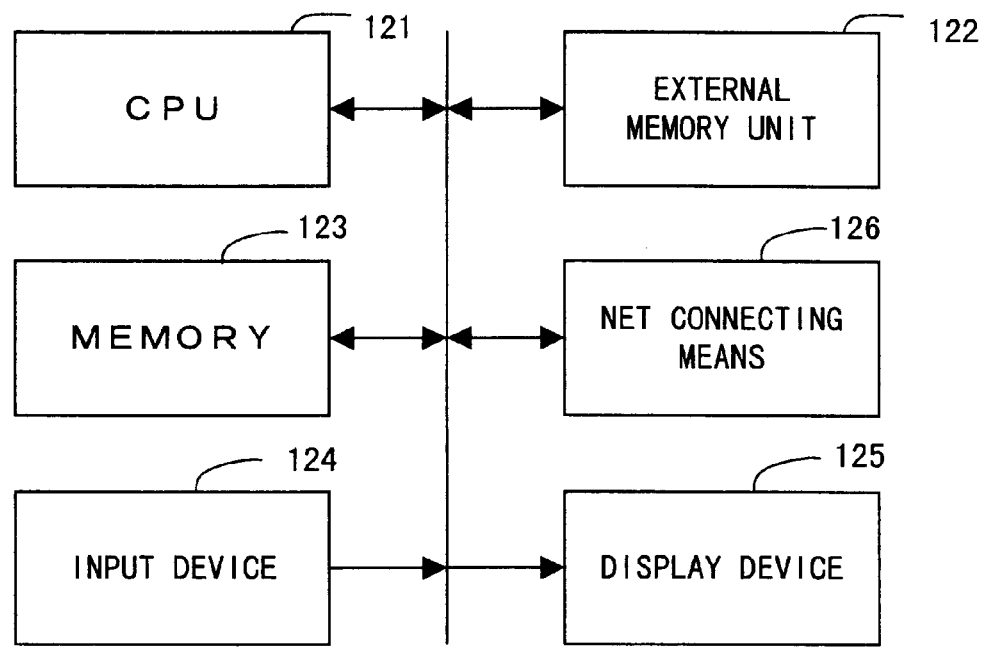
F I G. 1 9

LAYOUT INSTRUMENT FOR SEMICONDUCTOR INTEGRATED CIRCUITS, LAYOUT METHOD FOR SEMICONDUCTOR INTEGRATED CIRCUITS AND RECORDING MEDIUM THAT STORES A PROGRAM FOR DETERMINING LAYOUT OF SEMICONDUCTOR INTEGRATED CIRCUITS

BACKGROUND OF THE INVENTION

1. Field of the Invention

This invention relates to a layout instrument that lays out cells, etc., of a semiconductor integrated circuit, a layout method thereof and a recording medium that stores a program for determining the layout of a semiconductor integrated circuit.

2. Description of the Related Art

In a layout design of a large-scale integrated circuit (LSI), a layering layout method is used to enhance the efficiency of a design work. In the layering design method, the top module of the LSI is divided into logic that connects the sub-modules 11, 12, 13, . . . , and the sub-modules 11, 12 . . . , as shown in FIG. 1. Next, which region of a chip each of the sub-modules 11, 12 . . . , occupies is determined, and an internal layout of each sub-module 11, 12 . . . , is determined independently. There are two methods for connecting each of the sub-modules 11, 12 . . . : the method for connecting them before determining the internal layout and the method for connecting them after determining the internal layout. Such methods as this, if adopted, would have the following advantages.

(1) The interior of each module can be designed in parallel.
(2) Once the specifications for the interfaces of the sub-modules have been determined, the design of the sub-modules can be carried out even if no logical design of the interior of some sub-modules has been determined yet.
(3) The amount of data to be dealt with in large-scale integrated circuit (LSI) is enormously large, but the amount of data to be dealt with at one time can be reduced by handling the interior of a sub-module as a black box.

There is a delay restriction as the restriction that must be satisfied when designing synchronous LSI.

FIG. 2 is a diagram showing the delay restriction of synchronous LSI. In synchronous LSI, when a flip-flop receives a clock signal, a signal begins to be transmitted, and this signal passes through the cells 22, 23, and 24, and must be captured by the flip-flop 25 before the next clock arrives at the flip-flop 25. In order for LSI to work at a specified clock frequency, the time by which the signal arrives at the final flip-flop 25 must be kept within the delay restriction time. The longer the length of a wire, the greater the delay. So, the length of the wire should be made short at the part in which a severe delay restriction is imposed so that a layout that satisfies the delay restriction can be determined.

If a layout is only determined when carrying out a layering design without considering the delay of a signal, the layout in a particular sub-module can be determined without regard to the influence of the other sub-modules, thus making it possible to easily carry out a layering design.

However, when the delay of the signal needs to be taken into consideration, the delay of signals in the other sub-modules must also be taken into consideration. For instance, consider the path that starts from a flip-flop 32 in the sub-module 31 and arrives at a flip-flop 34 in the sub-module 33. When a layout in the sub-module 31 is determined, if cannot be determined to what extent the delay of the sub-module 31 can be allowed without considering the delay among the sub-modules and the delay in the sub-module 33.

Budgeting is the conventional method for solving this problem. In this conventional method, the maximum value of the delay in the sub-module of each path is allocated in advance, and each sub-module satisfies the allocated delay restriction so as to determine the layout in a sub-module without considering the delay of the other modules.

However, since a delay occurring in a sub-module is greatly influenced by the layout, a tolerable delay cannot be estimated until the layout is determined, thereby making it difficult to determine budgeting. To solve this problem, the delay in the other modules should be estimated as a large value, but if this is done, the maximum value of the delay allowable in the sub-modules becomes small, making it difficult to determine the layout that satisfies the delay restriction in the module.

Thus, in the conventional layering design method, there was such a difficult problem that it was difficult to appropriately estimate the delay in a sub-module and to determine an overall layout with high efficiency.

SUMMARY OF THE INVENTION

The purpose of this invention is to efficiently implement a layout design of semiconductor integrated circuits.

The layout instrument for semiconductor integrated circuits in the first embodiment of this invention consists of a provisional layout unit that performs a provisional layout of cells in sub-modules of a semiconductor integrated circuit, a sub-module layout unit that implements a layout and wiring among sub-modules, and a provisional layout correction unit that corrects a provisional layout of cells in sub-modules when the delay determined by the layout and wiring implemented by the sub-module layout unit does not satisfy a specified delay restriction.

After a provisional layout of cells in sub-modules is implemented, the layout and wiring among sub-modules are carried out. If the delay determined thereby does not satisfy a specified delay restriction, the provisional layout of the cells in the sub-modules is corrected, and then the layout and wiring among the sub-modules are implemented again. Therefore, if this invention is used, it is possible to enhance the efficiency for carrying out a layout design without having to do such an unnecessary thing, after an entire layout has been determined, that the layout and wiring are implemented again because some delay does not satisfy the delay restriction in the sub-modules.

The provisional layout unit or the provisional layout correction unit may set the weight of the net that connects the cells to a value corresponding to the delay restriction when implementing a provisional layout of cells in the sub-modules.

By configuring these units as described above, the net is weighted so as to satisfy the delay restriction, and a provisional layout of the cells is determined based on the weight of the net, so it is possible to lay out the cells in the sub-modules so as to satisfy the delay restriction.

The provisional layout correction unit may increase the weight of the net that cannot easily satisfy the delay restriction when correcting the provisional layout of the cells in the sub-modules. By configuring this unit as described above, the length of the wire for the net that cannot easily satisfy the delay restriction can be shortened, so it is possible to efficiently determine the layout of the cells in the sub-modules.

The provisional layout unit may set the weight of the net among the flip-flops connected to external terminals to a value corresponding to the delay restriction. By configuring this unit as described above, the length of the wire among the flip-flops that input signals from external terminals and output signals to external terminals can be shortened, and the delay restriction can be satisfied.

The provisional layout unit may make a virtual net that connects input and output terminals of the cells having a delay restriction in the sub-modules, and may provisionally lay out the cells based on the virtual net list including the virtual net. Since it is not necessary to determine the layout of all the cells in the sub-modules when performing a provisional layout of the cells in the sub-modules, the time required to determine the layout that satisfies the delay restriction can be shortened by configuring the provisional layout unit as described above.

If there exist a plurality of sub-modules that have the same logic, but have a different delay restriction, the provisional layout unit may make a virtual module that sets the severest delay restriction of all the delay restrictions of all the sub-modules, and lay out the interior of the virtual module, and then the sub-module layout unit may replace a plurality of sub-modules with the virtual module and perform the layout and wiring among the sub-modules.

By configuring the sub-module layout unit as mentioned above, when the provisional layout in the sub-modules is corrected, the provisional layout of only one virtual module can be corrected. Therefore, the work for correcting the provisional layout can be simplified, and the time required to determine an overall layout can be shortened.

BRIEF DESCRIPTION OF THE DRAWINGS

FIG. 4 is a diagram showing the layout instrument;

FIG. 6 is a flowchart showing the processing that determines the layout of a semiconductor integrated circuit;

FIG. 7 is a flowchart showing a path optimizing inter-sub-modules process;

FIG. 9 is a diagram showing a resistive network method;

FIG. 10 is a diagram showing an initial layout in the case where a cell is provisionally laid out in the center of a sub-module;

FIG. 13 is a diagram showing correction of a provisional layout;

FIG. 19 is a diagram showing the configuration of the layout instrument;

DESCRIPTION OF THE PREFERRED EMBODIMENTS

Described below are preferred embodiments with reference to the diagrams. FIG. 4 is the layout instrument for semiconductor integrated circuits related to this invention.

The layout instrument for semiconductor integrated circuits consists of a provisional layout unit 1 that performs a provisional layout of cells in sub-modules of a semiconductor integrated circuit, a sub-module layout unit 2 that implements the layout and wiring among sub-modules, and a provisional layout correction unit 3 that corrects a provisional layout of cells in sub-modules when the delay that is determined by the layout and wiring implemented by the sub-module layout unit 2 does not satisfy a specified delay restriction.

After a provisional layout of cells in sub-modules is implemented, the layout and wiring among the sub-modules are carried out. If the delay determined thereby does not satisfy the specified delay restriction, the provisional layout of the cells in the sub-modules is corrected, and then the layout and wiring among the sub-modules are implemented again. Therefore, if this invention is used, it is possible to enhance the efficiency for carrying out the work of a layout design without having to do such an unnecessary thing, after an overall layout has been determined, that the layout and wiring are implemented again because there is some delay that does not satisfy the delay restriction in the sub-modules.

Figure 5:
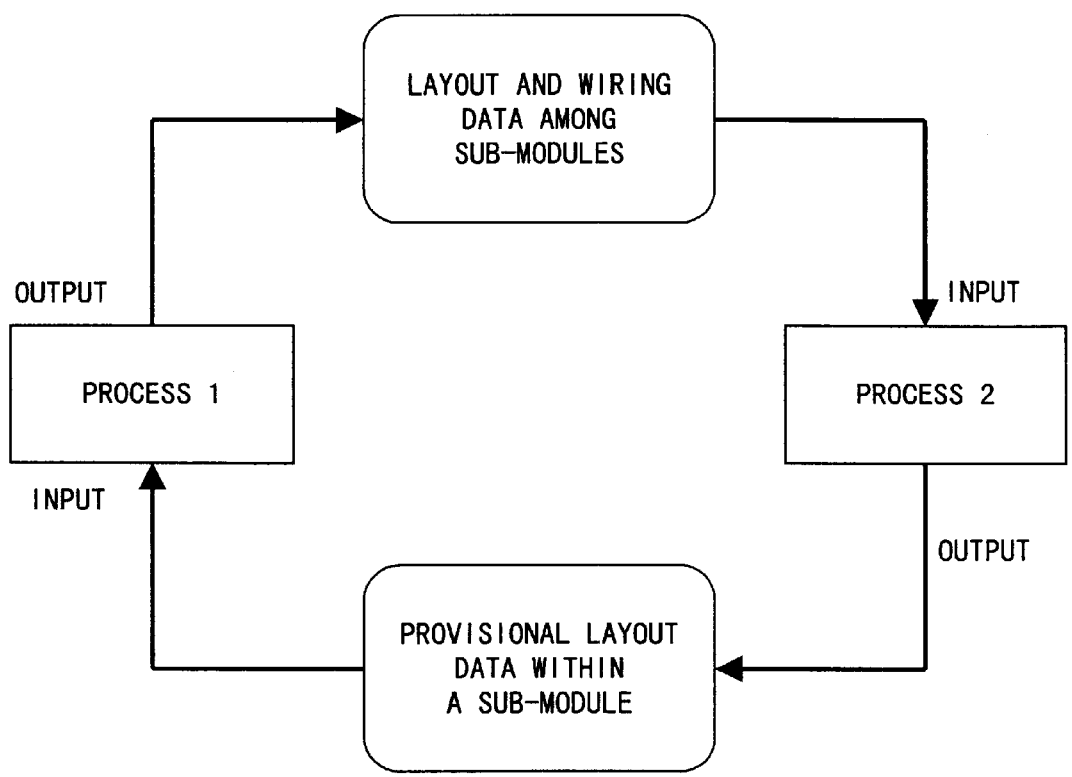
FIG. 5 explains the layout method.

FIG. 5 is a diagram showing the method related to this invention for laying out a semiconductor integrated circuit. In this layout method, a provisional layout of the cells in the sub-modules of a semiconductor integrated circuit is implemented, the layout and wiring among the sub-modules (FIG. 5, Process 1) are determined, and the provisional layout of the cells in the sub-modules is corrected (Process 2) if the delay among the sub-modules does not satisfy the specified delay restriction.

For example, Process 1 (the path optimizing inter-sub-modules process) optimizes the layout and wiring among the sub-modules based on the net list given in advance, makes data for the layout and wiring among the sub-modules, calculates the delay due to the wiring among the sub-modules based on said data, and judges whether the calculated delay satisfies the specified delay restriction.

If the delay among the sub-modules does not satisfy the delay restriction, Process 2 (the provisional layout of an in-sub-modules correcting process) corrects the provisional layout data so that the cells in the sub-modules can satisfy the delay restriction.

After a provisional layout of cells in the sub-modules is implemented, the layout and wiring among the sub-modules are carried out. If the delay determined thereby does not satisfy the specified delay restriction, the provisional layout of the cells in the sub-modules is corrected, and thus it is possible to efficiently determine a layout of an entire semiconductor integrated circuit.

FIG. 6 is a flowchart showing the processing that is executed by the layout instrument of the embodiment to determine the layout of a semiconductor integrated circuit. First, an initial provisional layout of the cells (such as an AND gate and a flip-flop etc.) in a sub-module and the weight of the net showing a connection among the cells are set (FIG. 6, S11). In this embodiment, the cells are laid out in the center of the sub-module as an initial provisional layout. Regarding the weighting of the cells, the following weighting is provided.

$$A\{d1(FF0,FF1)-d0(FF0,FF1)\} \div \{(dmax\ (FF0,FF1)-d0\ (FF0,FF1)\} \quad (1)$$

(A: a positive constant)

Formula (1) is the formula to obtain the weight of the net between flip-flops FF0 and FF1. d0 (FF0, FF1) is the delay of the net from flip-flop FF0 to FF1 obtained when the length of all the nets is assumed to be 0 (zero), and d1 is the delay of the net from flip-flop FF0 to FF1 obtained when the length of all the nets is assumed to be 1.

Therefore, the numerator of formula (1), [d1(FF0, FF1)−d0(FF0,FF1)], shows the increased amount of the delay resulting when the length of the wire is extended in the unit length. Also, dmax (FF0, FF1) is the delay restriction (a tolerable delay time) from flip-flop FF0 to FF1. The denominator of formula (1) shows a value obtained from the calculation of "the delay of the net from FF0 to FF1 of a flip-flop (i.e. the length of the wire is zero) is subtracted from the delay restriction dmax (FF0, FF1)." In other words, it shows a slack that is the difference between the value of the delay when the length of the wire is zero and the delay restriction time.

Therefore, formula (1) shows the ratio of the delay occurring when the length of the wire is extended by the unit length versus the slack. When the delay restriction is severe, the value of formula (1) becomes large, and the weight of the net becomes large.

When a provisional layout in a sub-module is determined and the weight of the net is set by formula (1), a path optimizing inter-sub-modules process is called, and the layout and wiring among the sub-modules are implemented.

FIG. 7 is a flowchart showing a path optimizing inter-sub-modules process. First, a layout among the sub-modules is implemented on the premise that the cells in the sub-modules are fixed in the position of the provisional layout (FIG. 7, S21). When the layout among the sub-modules is determined, global routing of the net among the sub-modules is implemented to determine the path of the net (S22).

The propagation delay is calculated from the length and shape of the net in which global routing has been performed, and delay optimization is performed (S23) There are delay optimization methods such as gate sizing and buffer insertion. For instance, gate sizing is a method for changing the gate used for the net that connects a plurality of sub-modules to a gate larger in size, specifically a gate having a larger driving capability in order to reduce the delay. Buffer insertion is a method for reducing the delay of the path of the branch base where the delay restriction is severe by inserting a buffer into a path in which the delay restriction of the branch is not severe, for instance, at the point the path branches. For instance, when the delay occurring at the path in which the delay restriction is severe is large, a buffer is inserted into another path immediately after the path branches, thereby making it possible to avoid the influence of the circuit of the path which a buffer has been inserted into and to reduce the delay of the path of the branch base.

When the layout and wiring among the sub-modules has been finished, the process proceeds from Step S12 of FIG. 6 to Step S13 of FIG. 6, and it is judged whether there is any part of wiring that does not satisfy the delay restriction among the sub-modules. If it is judged that there is any part of wiring that does not satisfy the delay restriction, the provisional layout correction in-sub-module process is called in Step S14 of FIG. 6 to correct the provisional layout in a sub-module.

Figure 8:
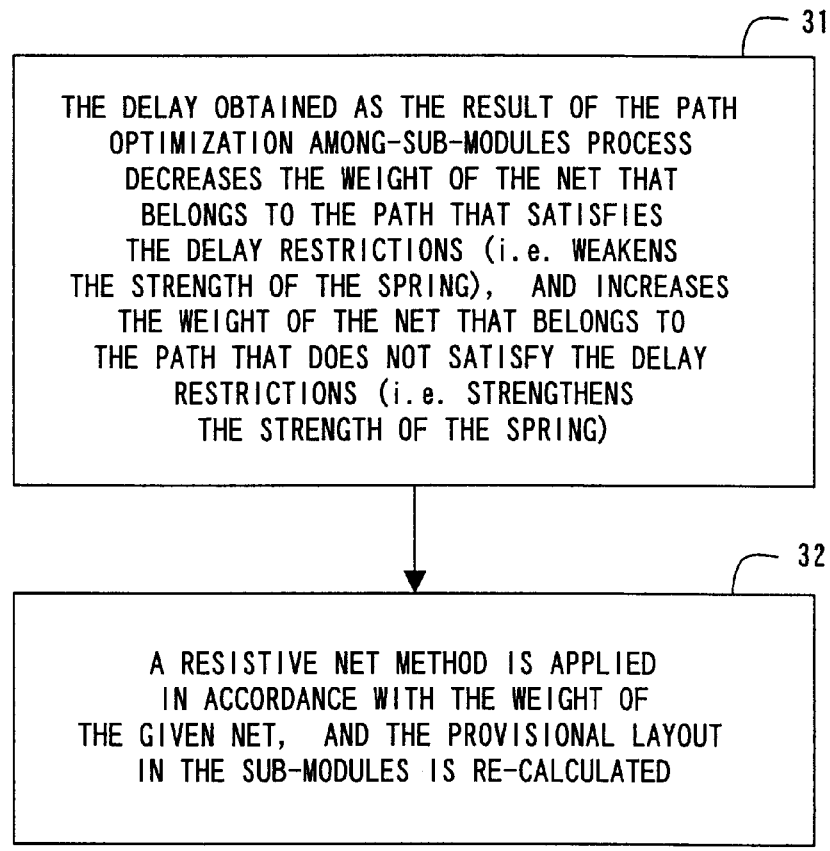
FIG. 8 is a flowchart showing a provisional layout correction of an in-sub-module process.

FIG. 8 is a flowchart showing a provisional layout correction in an sub-module process. The weight is made small for the net that has satisfied the delay restriction in the ones that have been made by a path optimizing an intermodules process (i.e. the spring of the resistive network is made weak), and the weight is made large for the net that does not satisfy the delay restriction (i.e. the spring of the resistive network is made strong) (FIG. 8, S31).

Next, the provisional layout in a sub-module is re-calculated in accordance with the set weight of the net using a resistive network method, and the provisional layout in the sub-module is corrected (S32). In the embodiment of this invention, a provisional layout of cells in a sub-module is determined based on a resistive network method, and thus the layout of cells is determined based on the weight of the net.

In the resistive network method, the net that connects external terminals 41, 42 and a cell 43, and the net that connects cells 43 and 44 are regarded as a spring, as shown in FIG. 9, and the layout of cells is pursued in such a way that the total sum of the mechanical energy of the spring becomes minimum. The position of the cell in which the energy of the spring becomes a minimum is the position where the result obtained by differentiating the energy is 0 (zero) Therefore, an optimum layout can be obtained by solving simultaneous linear equations that satisfy this condition. Since the weight of a net is shown as the strength of the spring, the net with greater weight is pulled down, and the length of the wire becomes shorter.

Figure 11:
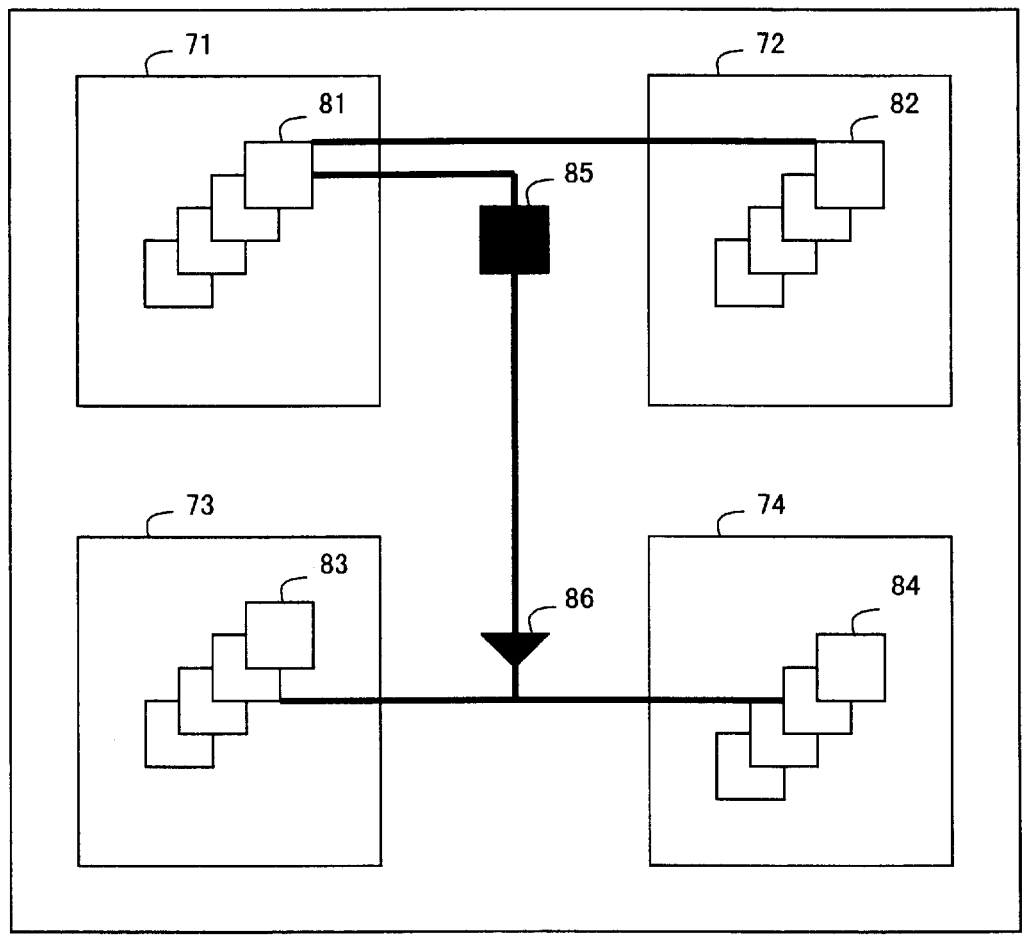
FIG. 11 is a diagram showing the layout and wiring implemented among sub-modules.
Figure 12:
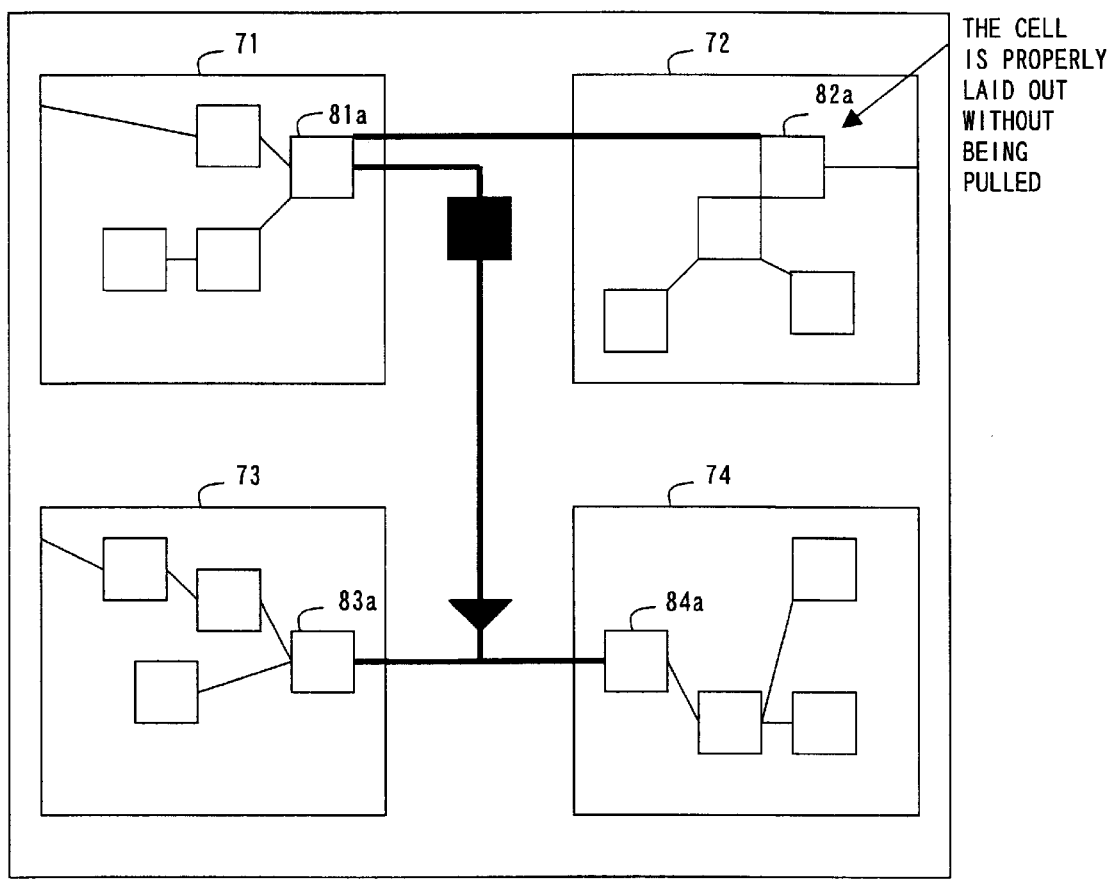
FIG. 12 is a diagram showing the correction of a provisional layout of cells in sub-modules.

As a method for performing an initial provisional layout of cells in a sub-module, the method for laying out cells in the center of a sub-module provisionally is adopted, as shown in FIG. 10. FIG. 11 is a diagram showing the layout of cells and wiring implemented among the sub-modules at the time of said initial provisional layout. FIG. 12 is a diagram showing a correction to the provisional layout in the sub-module after performing the layout and wiring among the sub-modules. First, cells 81 to 84 are provisionally laid out in the center of sub-modules 71 to 74 respectively, as shown in FIG. 10. At that time, the layout among the sub-modules has not yet been determined.

Next, the layout and wiring among a plurality of sub-modules are performed, as shown in FIG. 11 (the path indicated by thick solid lines in FIG. 11). In the example shown in FIG. 11, the cell 81 in the sub-module 71 is connected to the cell 82 in the sub-module 72, and the cell 81 in the sub-module 71 is connected to the cell 83 in the sub-module 73, and the cell 84 in the sub-module 74 via the cell 85 and the buffer 86.

When the layout and wiring among the sub-modules has been finished, the delay of the net among the sub-modules is calculated, and it is judged whether the calculated delay satisfies the delay restriction that has been determined in advance. If it is judged that the calculated delay satisfies the delay restriction, the cell 82a laid out in the center of the sub-module 72 shown in FIG. 12 remains in the position as is. However, if it is judged that the calculated delay does not satisfy the delay restriction, the cell 81a in the sub-module 71 shown in FIG. 12 is pulled toward the external terminal or the output terminal so that the length of the wire connected to the external terminal becomes short.

FIG. 12 is a diagram showing the case in which the delay of the net among sub-modules does not satisfy the delay restriction, and a provisional layout of cells in a sub-module is corrected. FIG. 12 shows that the delay of both the net indicated in a thick solid line that connects the cell 81a in the sub-module 71 to the cell 83a in the sub-module 73 and the net indicated in a thick solid line that connects 81a in the sub-module 71 to the cell 84a in the sub-module 74 does not satisfy the delay restriction. In this case, the layout is corrected so that the cells 81a, 83a and 84a that are connected to the external terminals of the sub-modules 71, 73 and 74 maybe pulled toward the external terminals or the output terminals in order to shorten the wiring length of the net.

FIG. 13 is a diagram showing another example of correcting a provisional layout in a sub-module. After the cells in the sub-modules 91 and 92 are provisionally laid out, the layout and wiring between the sub-modules are performed. If the delay of the path from a flip-flop 93 in the sub-module 91 to a flip-flop 94 in the sub-module 92 does not satisfy a specified delay restriction, the flip-flop 93 that is provisionally laid out in the sub-module 91 as well as the cell 95 are shifted toward the output terminal to shorten the length of the wire up to the output terminal. Likewise, the flip-flop 94 that is provisionally laid out in the sub-module 92 as well as the cells 96 and 97 are shifted toward the input terminal to shorten the length of the wire up to the input terminal. After that, the layout and wiring between the sub-module 91 and the sub-module 92 are performed based on the corrected provisional layout.

In the first embodiment of this invention, after a provisional layout in a sub-module is performed, the layout and wiring are performed among sub-modules. If the delay among sub-modules does not satisfy a specified delay restriction, the provisional layout of cells is corrected, and the layout and wiring among sub-modules are performed again to determine an entire layout. Therefore, it is possible to efficiently determine a layout and wiring in which the delay inside and outside sub-modules satisfies the delay restriction, as compared with the method for estimating a value of the delay in a sub-module in advance. In addition, since the correction of a provisional layout in a sub-module and the determination of a layout and wiring among sub-modules can be repeated until an entire layout of a integrated circuit is determined, it is possible to enhance the efficiency for carrying out a layout design of a semiconductor integrated circuit without having to do such an unnecessary thing, after an entire layout has been determined, that the layout and wiring are performed again because some delay does not satisfy the delay restriction in the sub-modules.

Next, described below is the second embodiment of this invention with reference to the flowchart shown in FIG. 14, where instead of determining a provisional layout of all the cells in a sub-module, a virtual net connecting input and output terminals of the cells in which a delay restriction is set is made, and a layout of the cells in a sub-module is determined based on a virtual net list including the virtual net.

Figure 14:
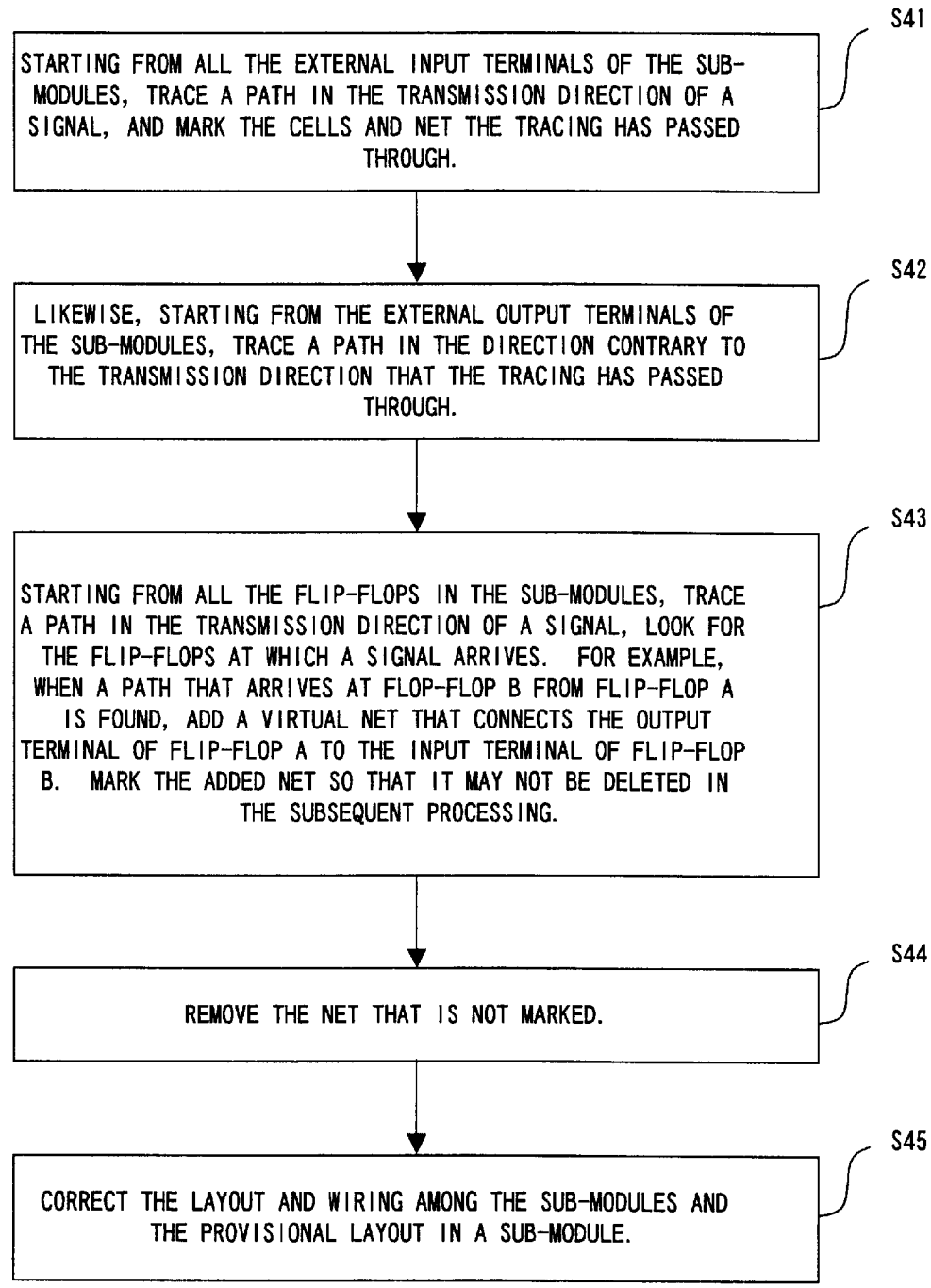
FIG. 14 is a flowchart showing that a virtual net is made in a sub-module to determine an overall layout.

First, starting from all the external input terminals of the sub-modules, trace a path in the transmission direction of a signal, and mark the cells and net that have been passed in the trace (FIG. 14, S41). Likewise, starting from the external output terminals of the sub-modules, trace a path in the direction contrary to the transmission direction of a signal, and mark the cells and net that the tracing has passed (S42). The cells and net laid out in the path connected to the external input and output terminals can be extracted based on said processing.

Next, in Step S43, starting from all the flip-flops in the sub-modules, trace a path in the transmission direction of a signal, look for the flip-flops at which a signal arrives, and mark the extracted flip-flops. When a path in which a plurality of flip-flops exist is detected, make a virtual net that directly connects the output terminal of the forward (according to the transmission direction of the signal) flip-flop to the input terminal of the backward flip-flop to which a signal transmitted from said output terminal is transmitted, and mark the added net so that it may not be deleted in the subsequent processing. Next, remove the cells and net that are not marked in the sub-modules (S44).

Then, a virtual net list is thereby made that is composed of the net and cells connected to the input terminal, the net and cells connected to the output terminal and a virtual net that directly connects the output terminal of a flip-flop and the input terminal of a flip-flop.

Figure 1:
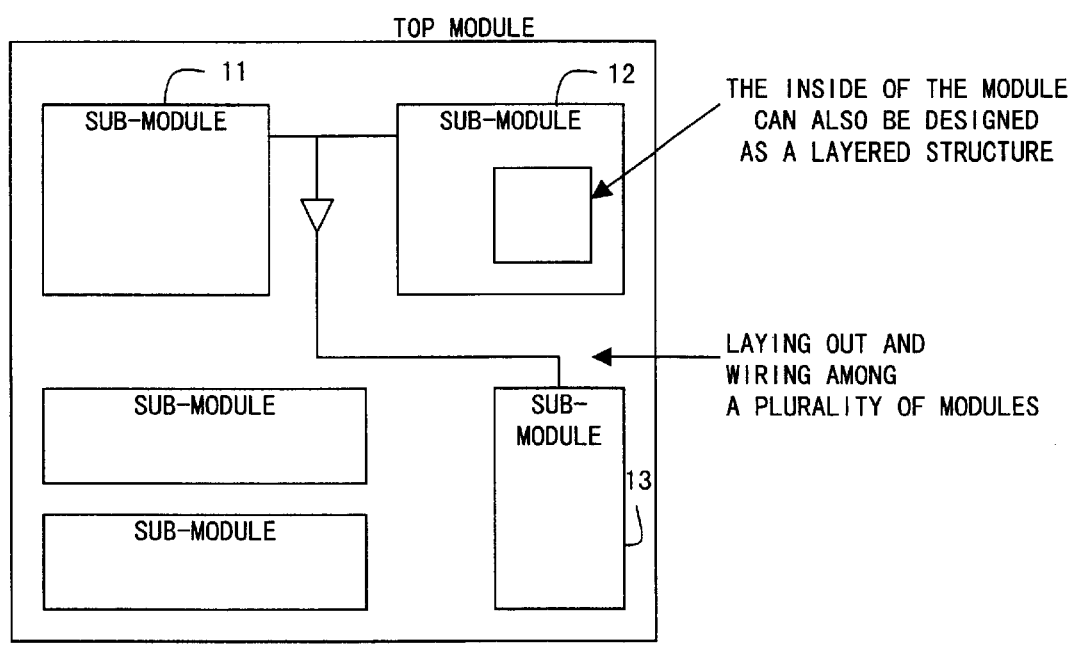
FIG. 1 is a diagram showing a layering design.
Figure 2:
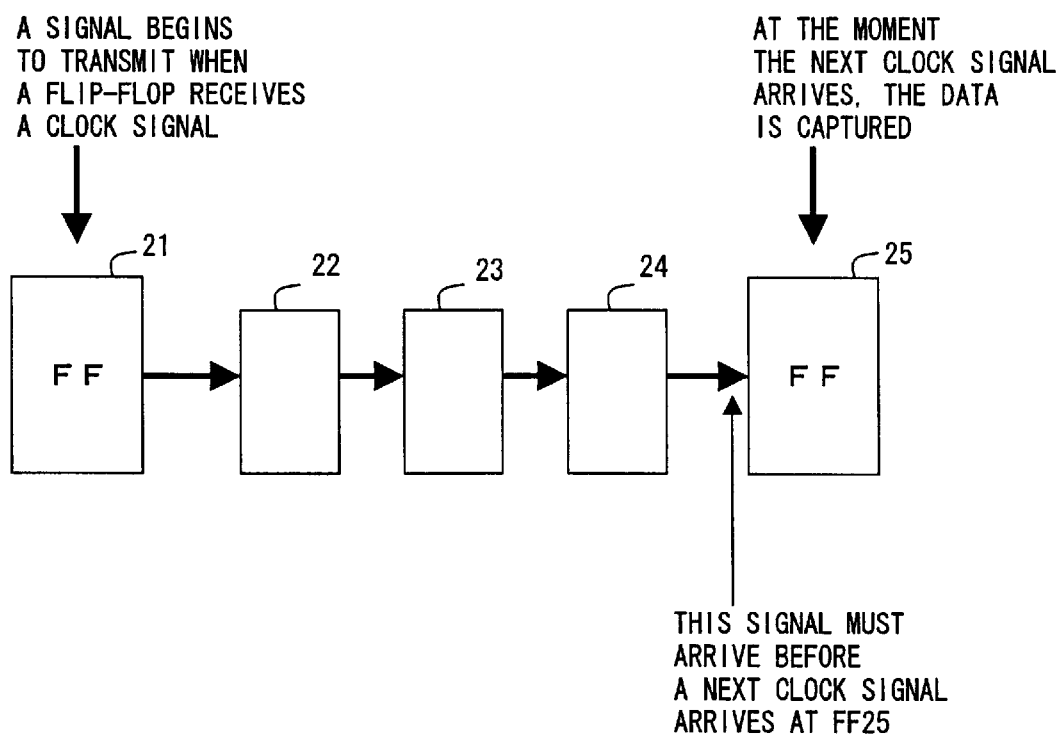
FIG. 2 is diagram showing the delay restriction of synchronous LSI.
Figure 3:
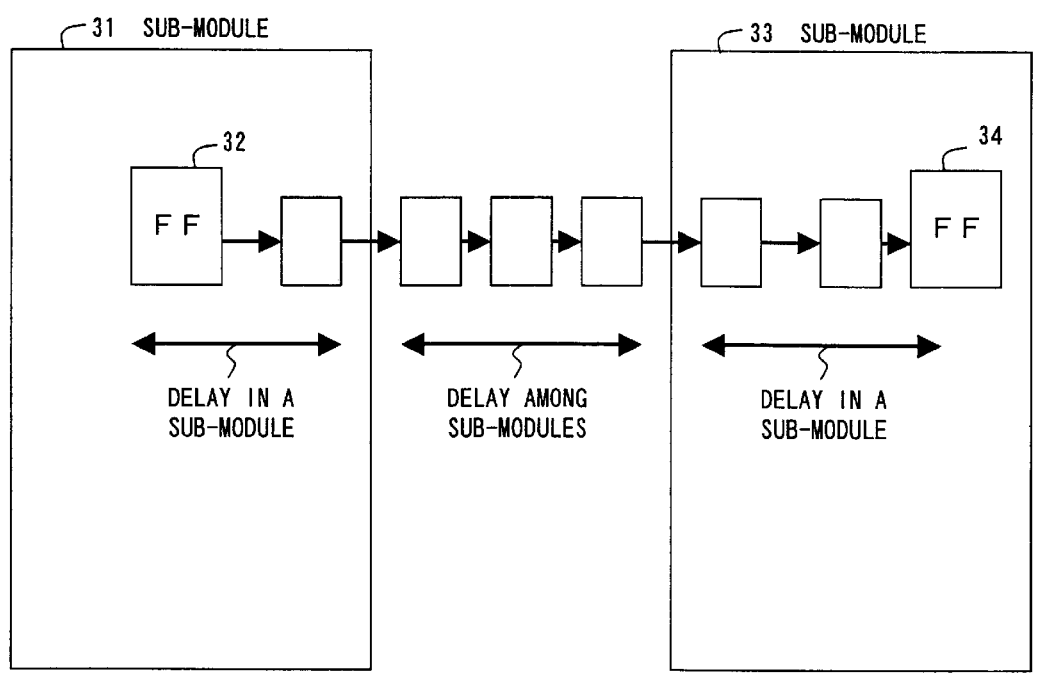
FIG. 3 is a diagram showing the delay within a sub-module and among sub-modules.

Now that a virtual layout in a sub-module has been determined based on the above processing, the processing for performing the layout and wiring between sub-modules, as shown in FIG. 3, and for correcting a provisional layout is executed in Step S45 to determine an overall layout.

Figure 15:
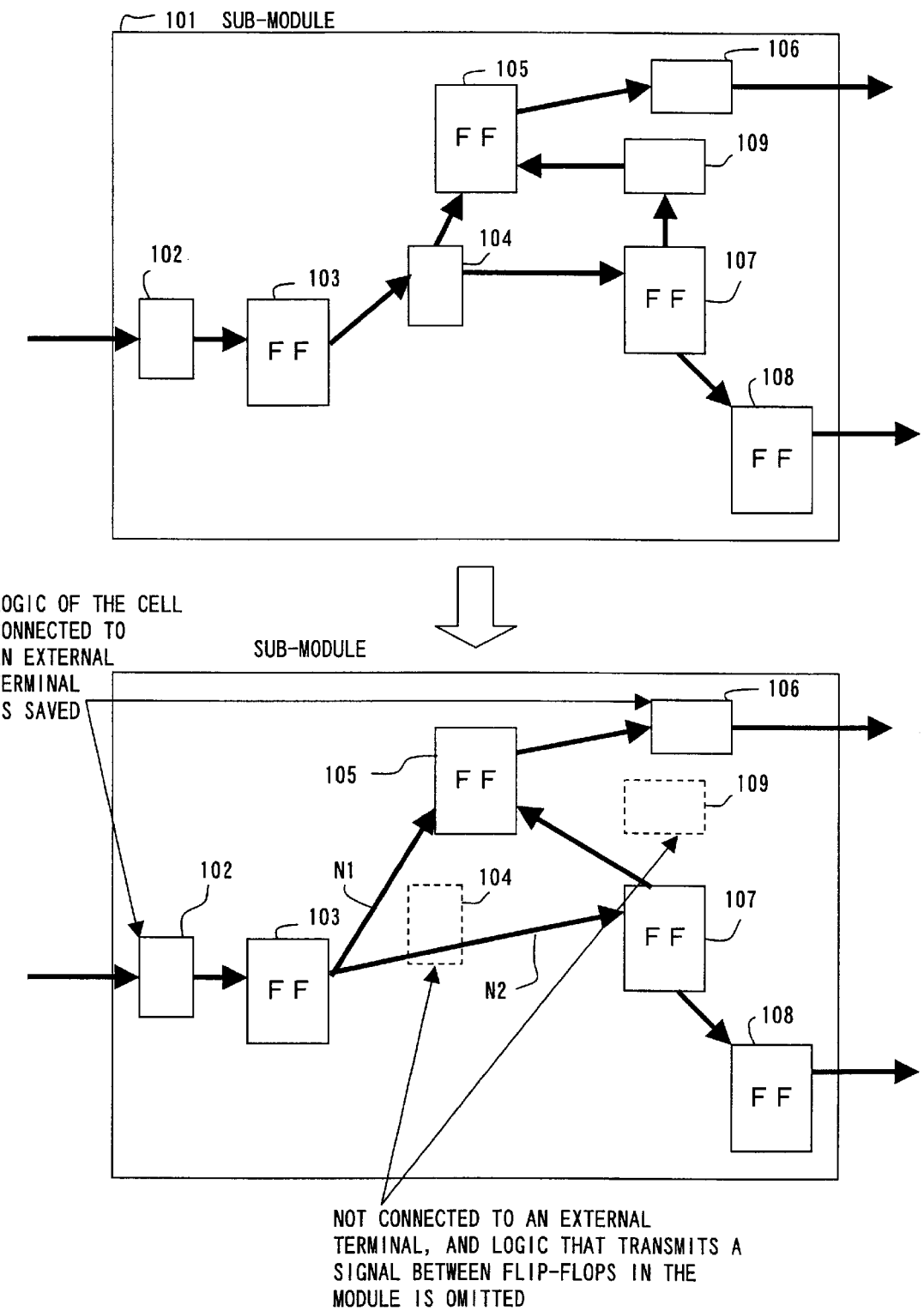
FIG. 15 is a diagram showing a virtual net that connects flip-flops in sub-modules.

FIG. 15 is a diagram showing a virtual net that connects flip-flops in a sub-module. The upper diagram shows the net of an original sub-module, while the lower diagram shows a virtual net that directly connects the input and output terminals of the flip-flops. The signal that is inputted from the input terminal of the sub-module 101 passes through the cell 102, the flip-flop 103, the cell 104, the flip-flop 105 and the cell 106, and is outputted from the output terminal. Also, the signal that is outputted from the flip-flop 103 to the cell 104 passes through the flip-flops 107 and 108, and is outputted from the output terminal. In addition, the signal that is outputted from the flip-flop 107 passes through the cell 109, and is inputted to the flip-flop 105.

When a virtual net is made in the sub-module 101 shown in FIG. 15 in accordance with the flowchart shown in FIG. 14, the path that passes through the cell 102 is connected to the input terminal, so it is saved as is.

The cell 104 that transmits an output signal of the flip-flop 103 to the flip-flops 105 and 107 is deleted when a virtual net is made to directly connect the output terminal of the flip-flop 103, the input terminal of the cell 104 and the input terminal of the flip-flop 107. The cell 109 that transmits an output signal of the flop-flip 107 to the flop-flip 105 is deleted when a virtual net is made to connect the output terminal of the flip-flop 107 and the input terminal of the flip-flop 105.

As a result, a virtual net N1 that directly connects the output terminal of the flip-flop 103 to the input terminal of the flip-flop 105, and a virtual net N2 that connects the output terminal of the flip-flop 103 to the input terminal of the flip-flop 107 are made, and the cell 104 indicated by a dotted line between them is deleted, as shown in the lower diagram of FIG. 15. Likewise, a virtual net N3 that directly connects the output terminal of the flip-flop 107 to the input terminal of the flip-flop 105 is made, and the cell 109 indicated by a dotted line (in the lower diagram of FIG. 15) between them is deleted.

In the above-mentioned second embodiment of the invention, the cell connected to the path in which a signal is transmitted from an external terminal, the cell connected to the path in which a signal is transmitted to the external terminal, and the cell in which a delay restriction is set (such as a flip-flop) in the cells existing in a sub-module, are saved, and a virtual net list that simplifies the connection in a sub-module is made, and a layout is determined based on the virtual net list, so that the determination of a provisional layout in a sub-module and the correction of the provisional layout that satisfies the delay restriction can be efficiently executed.

Figure 16:
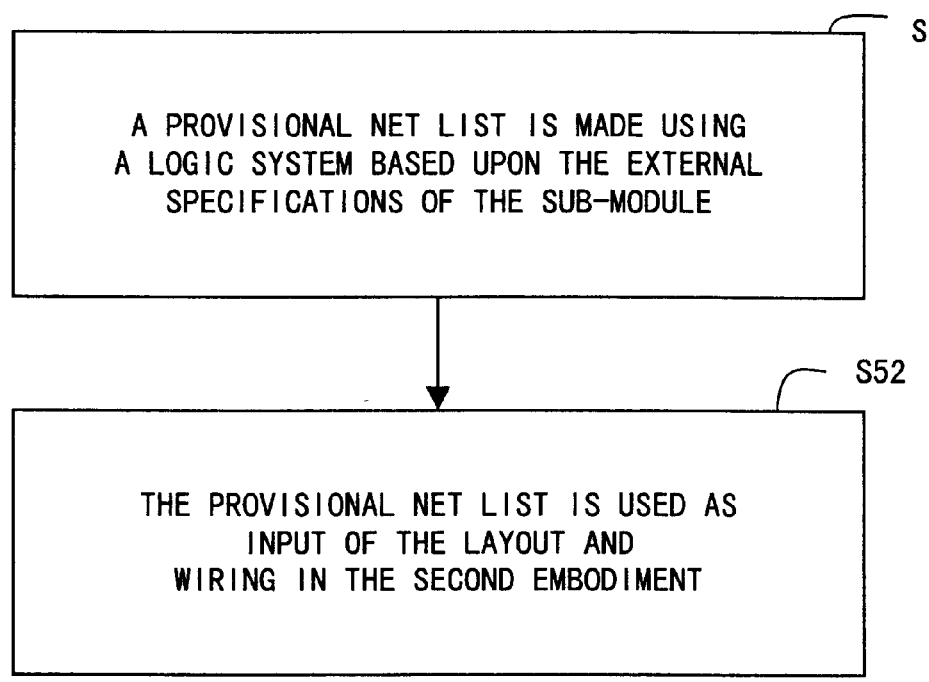
FIG. 16 is a flowchart showing that a provisional net list is made from external specifications to determine the layout.

Next, described below is the third embodiment of the invention that determines a layout of a semiconductor integrated circuit including a sub-module in which a net list has not been determined, with reference to the flowchart shown in FIG. 16.

When the external specifications that define input and output conditions of a sub-module are given, a provisional net list based on the external specifications is made using a logic composing system (FIG. 16, S51) The net list referred to here is what is described for the logic of a sub-module or of the whole integrated circuit, and the net referred to here is what is described for the logic between specific cells. Also, the logic composing system is the system that outputs a net list of the circuit that satisfies a given condition when a condition of input and output signals of a circuit is given. When a provisional net list has been made, the provisional net list is given as an input of the layout and wiring system in the second embodiment, and a provisional layout of cells in a sub-module is implemented based on the provisional net list (S52).

The reasons why a provisional layout in a sub-module is determined using the layout and wiring system in the second embodiment are given below. Since a net list that satisfies a certain specification of a sub-module exists infinitely, the net list that is made by a logic composing system is highly likely to be completely different from a finally determined net list. Therefore, even if a layout is determined on the premise of the provisional layout, the delay in a sub-module or among sub-modules may not satisfy a specified delay restriction, when a final net list has been determined, and so performing an entire layout may have to be made again.

However, concerning whether the delay of a signal transmitted among flip-flops can easily satisfy the delay restriction, from the standpoint of the delay occurring among flip-flops, almost the same tendency is shown between the delay among the flip-flops in the provisional net list made by a logic composing system and the delay among the flip-flops in the final net list.

Therefore, if a provisional net list that directly connects input and output terminals of flip-flops is made using the layout instrument of the second embodiment, and a provisional layout of flip-flops can be implemented so as to satisfy a specified delay restriction, it can be expected to lay out flip-flops so that the delay restriction may be satisfied in the final net list.

In this third embodiment of the invention, even if there is a sub-module in which a net list has not been determined, a provisional net list of the sub-module is made based on an external specification, and a lay out of flip-flops is determined based on the provisional net list so as to satisfy the delay restriction, thus making it possible to lay out flip-flops in the final net list to satisfy the delay restriction.

Figure 17:
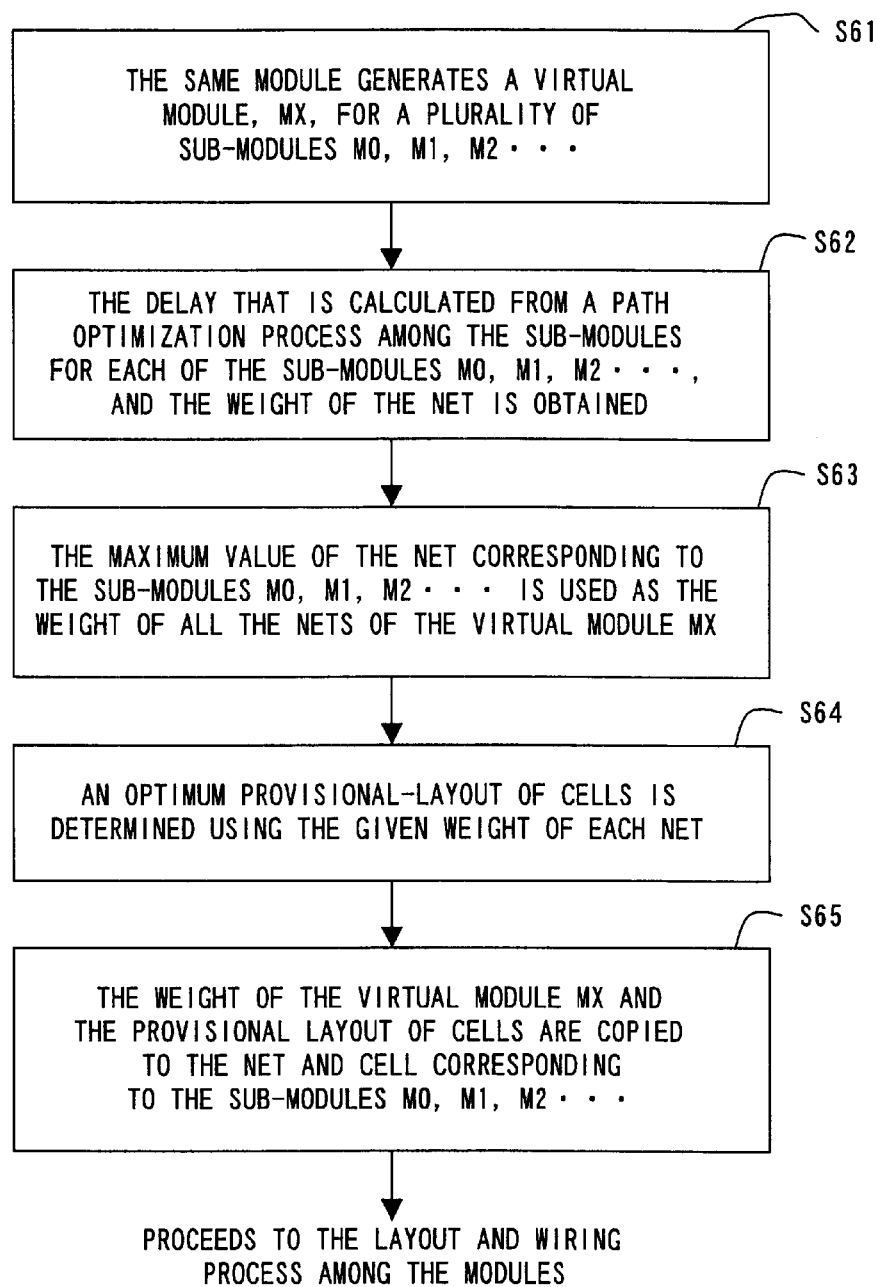
FIG. 17 is a flowchart showing that a provisional layout is implemented in sub-modules using a virtual module.

Next, FIG. 17 is a flowchart showing the fourth embodiment of the invention where, if there exist a plurality of sub-modules of the same configuration, such a provisional module is made that the severest delay restriction in that of a plurality of sub-modules is set, and an overall layout is determined using the provisional module.

A virtual module, MX, which has the same net list is made for sub-modules M0, M1, M2, ..., which are composed of the same sub-module (FIG. 17, S61). The delay of each sub-module, M0, M1, M2 ..., which is searched in a path optimizing inter-sub-modules process, is calculated, and the weight of each net is calculated from the given delay restriction and the delay calculated thereby (S62).

Next, the maximum value of the net corresponding to the sub-modules M0, M1, M2, ..., is used as the weight of all the nets of the virtual module MX (S63). Thus, the highest weight of the weight of the net of each sub-module M0, M1, M2, ..., that has the same net configuration is set to the net of the virtual module MX. An optimum provisional layout of cells is determined based on the resistive network method using the weight of each net of the virtual module MX (S64). The weight of the virtual module MX and the provisional layout of cells are copied to the net and cell corresponding to the sub-modules M0, M1, M2, ..., (S65). In other words, the sub-modules M0, M1, M2, ..., are replaced by the virtual module MX. Consequently, since the sub-modules M0, M1, M2 ... are replaced by the virtual module MX in which the highest weight is set for the delay restriction of each of the sub-modules, M0, M1, M2 ..., a layout among the sub-modules can be implemented based on the provisional layout of the virtual module MX.

Figure 18:
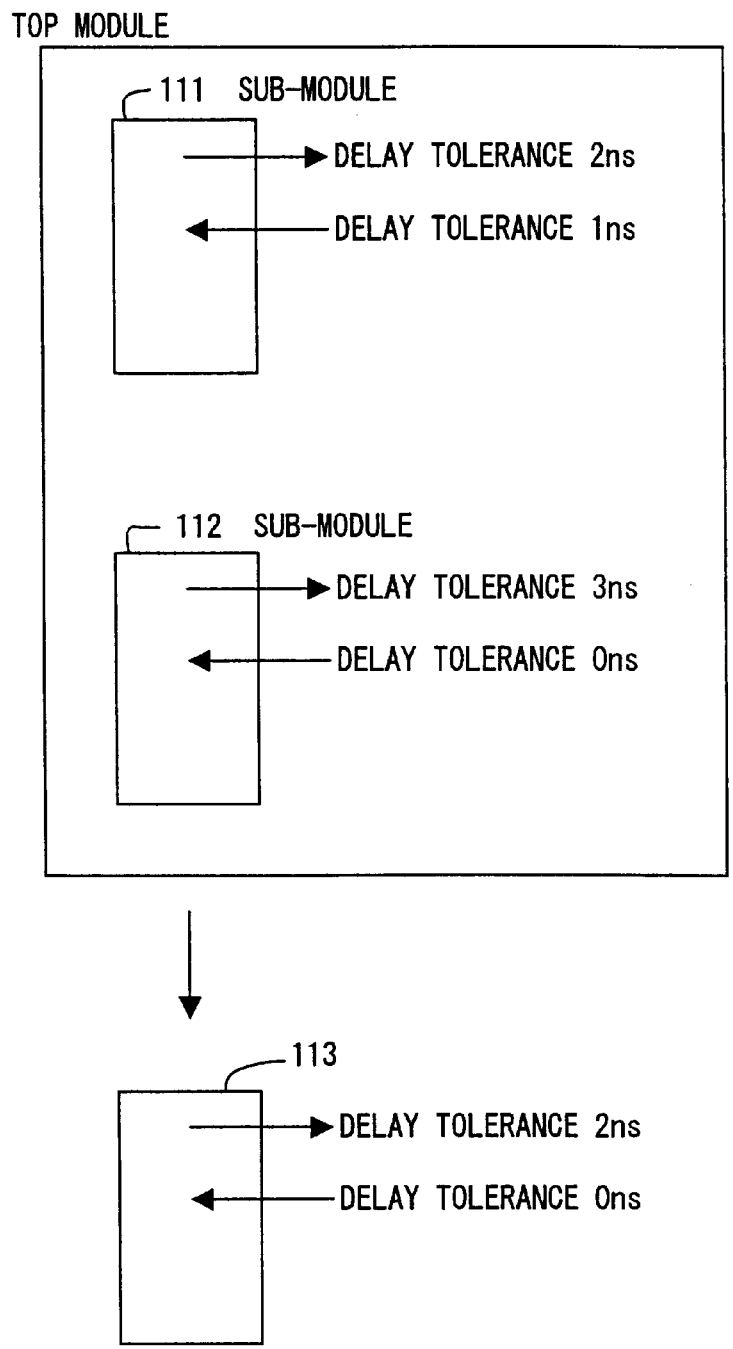
FIG. 18 is a diagram showing that sub-modules of the same configuration are replaced by a virtual module.

FIG. 18 is a diagram showing that sub-modules 111 and 112 of the same configuration which have a different delay restriction are replaced by a virtual module 113 that satisfies the delay restriction of both sub-modules. The sub-module 111 and the sub-module 112 have the same logic, but have a different delay restriction. The sub-module 111 has 1 ns of delay tolerance on the input side, and 2 ns on the output side. The sub-module 112 has 0 ns of delay tolerance on the input side, and 3 ns on the output side. Then, a virtual module 113 that has the same logic as that of both sub-modules and satisfies a severer condition between both the delay restrictions of the sub-modules 111 and 112 is made. The virtual module 113 has 0 ns of delay tolerance on the input side, and 2 ns on the output side, so it satisfies a severer condition between the delay restriction of the sub-module 111 and that of the sub-module 112. Therefore, an overall layout that satisfies both the delay restrictions of the sub-modules 111 and 112 can be determined by replacing the sub-modules 111 and 112 with the virtual module 113 and determining the layout of the top module (the whole integrated circuit) based on the provisional layouts of these sub-modules.

This fourth embodiment of the invention is to replace a plurality of sub-modules that have the same logic with a virtual module MX, which has a delay restriction corresponding to the severest delay restriction of the sub-modules. The only thing that has to be done to determine a provisional layout of one virtual module. It is not necessary to determine provisional layouts of a plurality of sub-modules, thus facilitating a layout design of a integrated circuit and reducing the number of man-hours required for said layout design.

The layout instrument in the above-mentioned embodiment can be configured using an information processing instrument (computer), as shown in FIG. 19. The information processing instrument consists of a CPU 121, an external storage 122, a memory 123, an input device 124, a display device 125 and a network connection device 126, and all of them are connected to one another by a bus 127.

The external storage 122 is composed of a hard desk, etc., and is used to store a net list of a semiconductor integrated circuit and a layout program for determining the layout of a semiconductor integrated circuit. The layout program, etc., stored in the external storage 112 are read by the CPU 121, and are stored in the memory 123, and are then processed. The input device 124 is composed of a keyboard, a touch panel provided on the display device 125, etc., and is used to input information obtained from users. The display device 125 is composed of a CRT, a liquid-crystal display device, etc., and is used to display the results of layout. The network connection device 126 is used to receive or transmit data and a program from or to other devices via such a line as a LAN (local area network).

Figure 20:
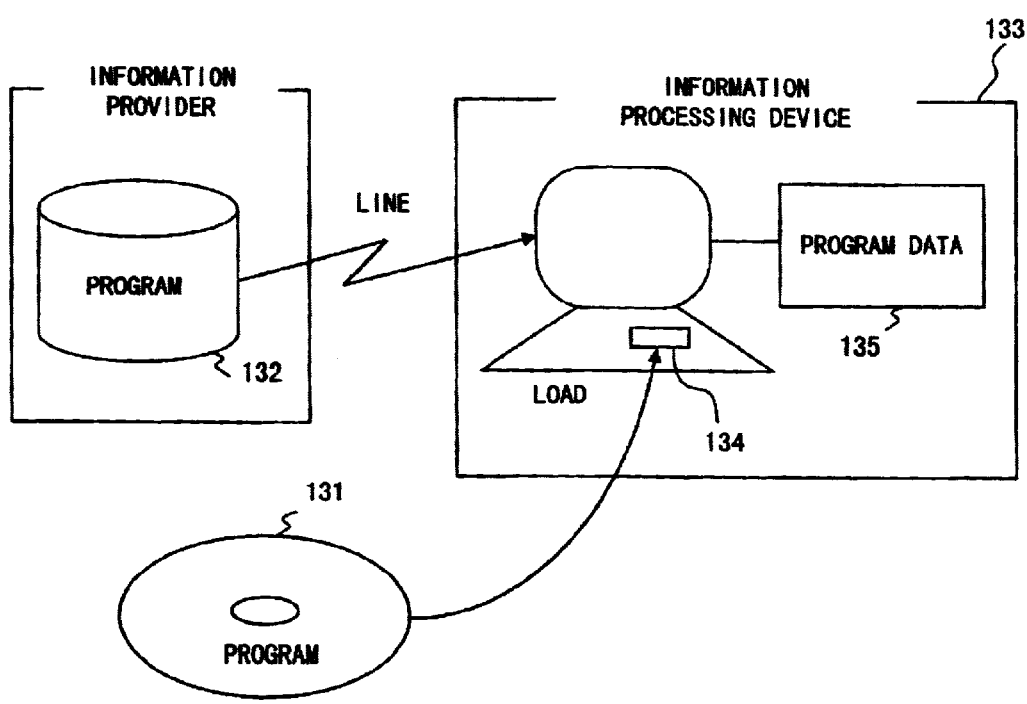
FIG. 20 is a diagram showing the recording medium.

FIG. 20 is a diagram showing a recording medium. The layout program that determines the layout of a semiconductor integrated circuit is stored in a portable recording medium 131 such as a CD-ROM and a floppy disk or in a storage 132 that a program provider has, and said program is loaded into an information processing instrument (layout instrument) 133 that the user has, and then it is executed.

If the layout program is stored in a portable recording medium 131 such as a CD-ROM and a floppy disk, the portable recording medium 131 is inserted in a drive device 134 in the information processing instrument 133 to read the program, and the read program is stored in a storage 135 such as a RAM and a hard disk, and then the program is executed. If the program is supplied by a program provider via a telecommunication line, the program stored in the storage 132 of the program provider or in a memory is received by the information processing instrument via a telecommunication line, and the received program is stored in the storage 135 such as a RAM and a hard disk, and then it is executed. The program stored in a portable recording medium 131 may be one that has a partial function of the program described in the embodiment of the invention.

In the above-mentioned embodiment, after a provisional layout in a sub-module is performed, the layout and wiring among sub-modules are implemented; if the results of the layout do not satisfy a specified delay restriction, the provisional layout in a sub-module is corrected; the layout among sub-modules is made again to determine an overall layout. As a result, it is possible to enhance the efficiency for carrying out a layout design and to prevent such an unnecessary thing that the layout and wiring are implemented repeatedly after an overall layout has been determined, because a sub-module(s) does not satisfy the delay restriction.

In the above-mentioned embodiment, a cell in an initial provisional-layout is laid out in the center of a sub-module, but an initial layout, not limited to it, which is suitable for an applied layout method can be used. For instance, a layout rule is determined in advance based on an empirical rule, and an initial layout may be determined based on the layout rule.

As a method for determining a layout in a sub-module, there is not only a resistive network method but also a method in which a sub-module is divided into a plurality of regions, and the divided regions are further divided to determine the layout of a cell. Also, the cell that makes a provisional net is not limited to a flip-flop, but can be a cell other than a flip-flop that is required to satisfy a delay restriction.

This invention, if used, makes it possible to reduce the work for correcting the layout and wiring that is required until an overall layout of a semiconductor integrated circuit is determined and to enhance the efficiency for performing a layout design.

What is claimed is:

1. A layout instrument for a semiconductor integrated circuit, comprising:
   a provisional layout unit performing a provisional layout to position a plurality of cells in a sub-module of a semiconductor integrated circuit;
   a sub-module layout unit performing layout and wiring among sub-modules; and
   a provisional layout correction unit correcting the provisional layout by moving the positions of the plurality of cells in the sub-module when a delay determined by layout and wiring among sub-modules does not satisfy a specified delay restriction.

2. The layout instrument for the semiconductor integrated circuit according to claim 1, in which the layout of the cell and sub-module that satisfy the delay restriction is determined by repeating the work of the layout and wiring among sub-modules which is performed by said sub-module layout unit as well as the work for correcting the provisional layout of the cells in the sub-module that is performed by said provisional layout correction unit.

3. The layout instrument for the semiconductor integrated circuit according to claim 1, in which said provisional layout unit or said provisional layout correction unit sets a weight of a net that connects the cells to a value appropriate for the delay restriction when performing the provisional layout in the sub-module.

4. The layout instrument for the semiconductor integrated circuit according to claim 3, in which said provisional layout correction unit increases the weight of the net that cannot easily satisfy the delay restriction when correcting the provisional layout of cells in the sub-module.

5. The layout instrument for the semiconductor integrated circuit according to claim 1, in which said provisional layout correction unit sets a weight of the net between a plurality of flip-flops connected to a plurality of external terminals to a value conformable to the delay restriction.

6. The layout instrument for the semiconductor integrated circuit according to claim 1, in which said provisional layout unit makes a virtual net that connects a plurality of input and output terminals of the cell having the delay restriction in the sub-module, and implements the provisional layout based on the virtual net list including the virtual net.

7. The layout instrument for the semiconductor integrated circuit according to claim 1, in which said provisional layout unit makes a virtual net that directly connects a plurality of input terminals and output terminals of a plurality of flip-flops connected to a path that is connected to a plurality of external terminals, and implements the provisional layout based on the virtual net.

8. The layout instrument for the semiconductor integrated circuit according to claim 1, in which when there exist the plurality of sub-modules that have the same logic but have a different delay restriction, said provisional layout unit makes a virtual module that sets the severest delay restriction in the delay restrictions of said plurality of sub-modules, performs the provisional layout in the virtual module, and said sub-module layout unit replaces said plurality of sub-modules with the virtual modules, and performs layout and wiring among the sub-modules.

9. A layout method for a semiconductor integrated circuit, comprising:
   performing a provisional layout to position a plurality of cells in a sub-module of the semiconductor integrated circuit, and layout and wiring among sub-modules; and
   correcting the provisional layout to move the positions of the cells in the sub-module when a delay determined by the layout and wiring among sub-modules does not satisfy a specified delay restriction.

10. The layout method for the semiconductor integrated circuit according to claim 9, in which the layout of the cells and sub-modules that satisfy the specified delay restriction is determined by repeating the process of layout and wiring among sub-modules and the process of correcting the provisional layout of cells in the sub-module.

11. The layout method for semiconductor integrated circuit according to claim 9, in which a weight of a net that connects the cells is set to a value appropriate for the delay restriction when the provisional layout of cells in the sub-module is performed.

12. The layout method for the semiconductor integrated circuit according to claim 9, in which the provisional layout unit makes a virtual net that connects a plurality of input and output terminals of the cell having the delay restriction in the sub-module, and implements the provisional layout based on the virtual net list including the virtual net.

13. A computer-readable storage medium on which is recorded a program for causing a computer to execute a process determining a layout of a semiconductor integrated circuit, comprising:

performing a provisional layout to position a plurality of cells in a sub-module of the semiconductor integrated circuit, and performing wiring among sub-modules; and correcting the provisional layout to move the positions of the cells in the sub-module when a delay that is determined by the layout and wiring among sub-modules does not satisfy a delay restriction.

14. A layout method of an integrated circuit having a plurality of cells in each sub-module, comprising:

positioning the cells in more than one sub-module of the integrated circuit;

connecting a wiring path between the cells and between the sub-modules; and repositioning the cells in the sub-modules without disconnecting the wiring paths between the cells and the sub-modules if a specified delay time restriction is not satisfied; or establishing the positioned cells and the wiring paths as a final layout if the delay time restriction is satisfied.

15. A layout method of an integrated circuit having a plurality of cells in sub-modules, comprising:

calculating a time delay between each pair of the sub-modules; and moving a position of the cells in the sub-modules until the time delay of each pair of the sub-modules is less than a threshold time delay.

16. A layout method of an integrated circuit having cells in sub-modules, comprising:

positioning the sub-modules on the integrated circuit;

arranging the cells in the sub-modules;

implementing wiring between the sub-modules; and correcting positions of the arranged cells in each sub-module when a time delay between the sub-modules is not satisfied.

* * * * *